(12) United States Patent
Aguiar dos Santos et al.

(10) Patent No.: US 9,497,870 B2
(45) Date of Patent: Nov. 15, 2016

(54) HOUSING FASTENING ELEMENT, HOUSING LOCKING SYSTEM AND METHOD, A COMPRESSOR AND AN INVERTER

(71) Applicant: WHIRLPOOL S.A., São Paulo, SP (BR)

(72) Inventors: Gian Carlo Aguiar dos Santos, Joinville (BR); Jose Feuser Filho, Joinville (BR)

(73) Assignee: Whirlpool S.A., Sao Paulo (BR)

( * ) Notice: Subject to any disclaimer, the term of this patent is extended or adjusted under 35 U.S.C. 154(b) by 148 days.

(21) Appl. No.: 14/401,387

(22) PCT Filed: May 17, 2013

(86) PCT No.: PCT/BR2013/000171
§ 371 (c)(1),
(2) Date: Nov. 14, 2014

(87) PCT Pub. No.: WO2013/170331
PCT Pub. Date: Nov. 21, 2013

(65) Prior Publication Data
US 2015/0145396 A1     May 28, 2015

(30) Foreign Application Priority Data
May 17, 2012    (BR) .......................... 10 2012 011804

(51) Int. Cl.
  *H05K 5/00* (2006.01)
  *H05K 5/02* (2006.01)

(52) U.S. Cl.
  CPC .......... *H05K 5/0221* (2013.01); *H05K 5/0013* (2013.01); *H05K 5/0208* (2013.01)

(58) Field of Classification Search
  CPC ........ H02G 3/08; H02G 3/081; H02G 3/086; H02G 3/14; H05K 5/00; H05K 5/02; H05K 5/0208; H05K 5/0217; H05K 5/0221; H05K 5/0247; H05K 5/0013

USPC ....... 174/50, 520, 559, 17 R, 560, 561, 562, 174/535; 220/3.2, 3.8, 4.02; 439/535, 76.1, 439/76.2
See application file for complete search history.

(56) References Cited

U.S. PATENT DOCUMENTS

| 8,633,383 B2 * | 1/2014 | Akahori | H01R 9/2458 174/50 |
| 8,785,775 B2 * | 7/2014 | Takeuchi | H05K 5/063 174/50 |
| 8,866,013 B2 * | 10/2014 | Masumoto | H02G 3/08 174/50 |

(Continued)

FOREIGN PATENT DOCUMENTS

| DE | 33 46 243 A1 | 7/1985 |
| DE | 10 2006 061 703 A1 | 7/2008 |
| DE | 10 2007 051 716 A1 | 5/2009 |

OTHER PUBLICATIONS

International Search Report mailed Oct. 31, 2013 for International application No. PCT/BR2013/000171.

(Continued)

*Primary Examiner* — Angel R Estrada
(74) *Attorney, Agent, or Firm* — Fay Sharpe LLP

(57) ABSTRACT

A system and method of locking housings that have two different stages, one being generally used for transportation after an initial production stage, and the other being intended for final use of the product, preferably used on electric compressor inverters. One example presents a system for locking housings that have a base (1), a cover (2) and internal elements (4) arranged in an internal portion of the base (1), the cover (2) being locked to the base (1) by at least one fastening element (3), the fastening element (3) having first reversible locking stage (a) and second irreversible locking stage (b), the locking system being configured so that the reversible locking stage (a) will enable the opening of the housing for access to the internal elements (4), and the irreversible locking stage (b) will effect tamper-proof closure of the housing.

14 Claims, 5 Drawing Sheets

(56) References Cited

U.S. PATENT DOCUMENTS 8,907,230 B2* 12/2014 Chen ................ H02G 3/16
                                              174/520
8,927,860 B2*  1/2015 Yamamoto ......... H02G 3/14
                                              174/50

OTHER PUBLICATIONS

Written Opinion of the International Searching Authority mailed Oct. 31, 2013 for International application No. PCT/BR2013/000171.

* cited by examiner

HOUSING FASTENING ELEMENT, HOUSING LOCKING SYSTEM AND METHOD, A COMPRESSOR AND AN INVERTER

This application claims priority of Brazilian patent case No. BR102012011804-1 filed on May 17, 2012, the contents of which are integrally incorporated here by reference.

The present invention relates to a housing-locking system and method having two different stages, one being used for transportation after an initial production stage, and the other for final use of the product, preferably used on electric compressor inverters.

DESCRIPTION OF THE PRIOR ART

At present, production costs vary enormously, depending on the location where the factories are installed. In order to fit in with such differences, a number of companies have modified their production line, so that the manufacture of components that do not require skilled labor will be made at a location where production costs are low, while the finishing and possible tests of the final product will be made at a different location, using skilled labor, which is more expensive.

Such adaptations of production lines end up by bringing one more problem to the assembling procedure, since the distance between the production lines may be extremely long, and such steps may even be carried out in different countries. For this reason, the internal parts of the products should be protected during storage and transport of the unfinished product, without introducing difficulties upon opening the packages for completion of the production.

The use of the present-day techniques, such as for instance, employing screws, delays the product finishing step, since a skilled technician has to remove all the screws, complete the assembly and then replace all the screws to close the housing. Since such a final assembly step uses skilled labor, the increase in costs due to loss of time for opening and closing the housing raises the final production cost drastically.

In an attempt to solve this problem, other techniques employ snap-fit locks. These types of lock, however, have the drawback of facilitating the opening of the product, even after completion of the assembly. This entails less security of the product, including the users, when the components to be protected comprise electric or even chemical equipment, as in the case of inverters for compressors, which is the preferred use of this invention.

OBJECTIVES OF THE INVENTION

Thus, it is an objective of the present invention to provide a fastening element that is capable of providing protection for the internal elements of a product during storage and transportation after an initial production step, as well as the security of the internal elements of the product during the use thereof and, therefore, after completing the production.

It is another objective of the present invention that such a fastening element should be easy to handle and should enable one to open the product rapidly to continue the production secure locking after completing the production.

BRIEF DESCRIPTION OF THE INVENTION

A first embodiment of the invention has a housing locking system comprising a base, a cover and internal elements arranged in an internal portion of the base, the cover being locked onto the base by means of eat least one fastening element, the fastening element having first reversible locking stage and second irreversible locking stage, the locking system being configured so that the reversible locking stage will enable one to open the housing for access to the internal elements, and the irreversible locking stage will effect the tamper-proof closure of the housing.

The invention also presents a housing fastening element comprising a base, a cover and internal elements, wherein the cover is fixed to the base by means of the fastening element, protecting the internal elements, the fastening element having first reversible locking stage and second irreversible locking stage, the reversible locking stage being configured to enable protection of the internal elements and enable the opening of the housing for access to the internal elements, and the irreversible locking stage being configured to effect the tamper-proof closure of the housing.

Additionally, a protection housing for an electric compressor inverter is provided, the housing having a base, a cover, at least one fastening element and internal elements, the cover being locked to the base by means of the fastening element, protecting the internal elements that are fixed to the base, the fastening element having first reversible locking stage and second irreversible locking stage, the reversible locking stage being configured to enable protection of the internal elements and enable the opening of the housing for access to the internal elements, and the irreversible locking stage being configured to effect the tamper-proof closure of the housing.

In this regard, an electric compressor and an electric-compressor inverter are provided, which use the present invention, as well as a method for locking housings for electric compressor inverter, the housings comprising a base, a cover, a fastening element and internal elements, the method having the steps of:
(a) mounting a part of the internal elements on the base;
(b) locking the cover to the base by means of first reversible locking stage of the fastening element, configured to keep a vertical distance between the base and the cover and enable one to open the housing for access to the internal elements;
(c) reversing the housing locking and mounting the remaining internal elements on the base;
(d) locking the cover to the base by means of second irreversible locking stage of the fastening element, configured to effect tamper-proof closure of the housing and protect the internal elements mounted on the base.

BRIEF DESCRIPTION OF THE DRAWINGS

The present invention will now be described in greater detail with reference to an embodiment represented in the drawings. The figures show.

DETAILED DESCRIPTION OF THE FIGURES

Figure 1:
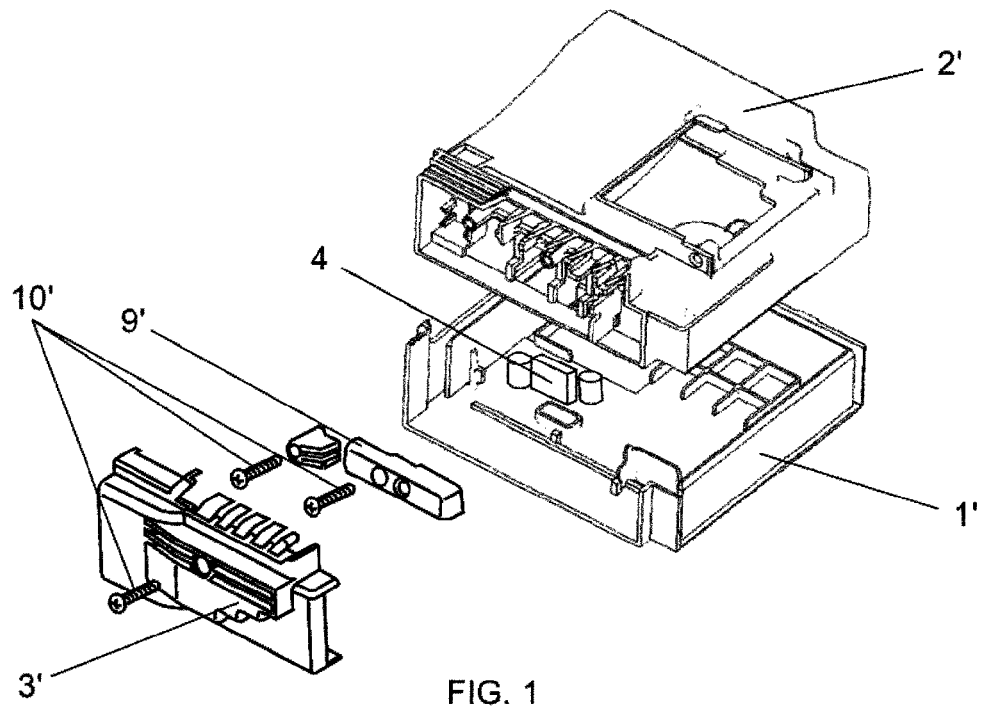
FIG. 1 is a representation of a inverter housing used in the prior art.

FIG. 1 shows the prior art usually employed in locking a inverter protection housing. In this case, a cover 2' is fixed to a base 1' by means of a fastening element 3', for protecting the internal elements 4. As can be seen in FIG. 1, the employ of screws 10' for closing, including for connecting the cable fasteners 9', makes it difficult to open and close the protection housing.

Figure 2:
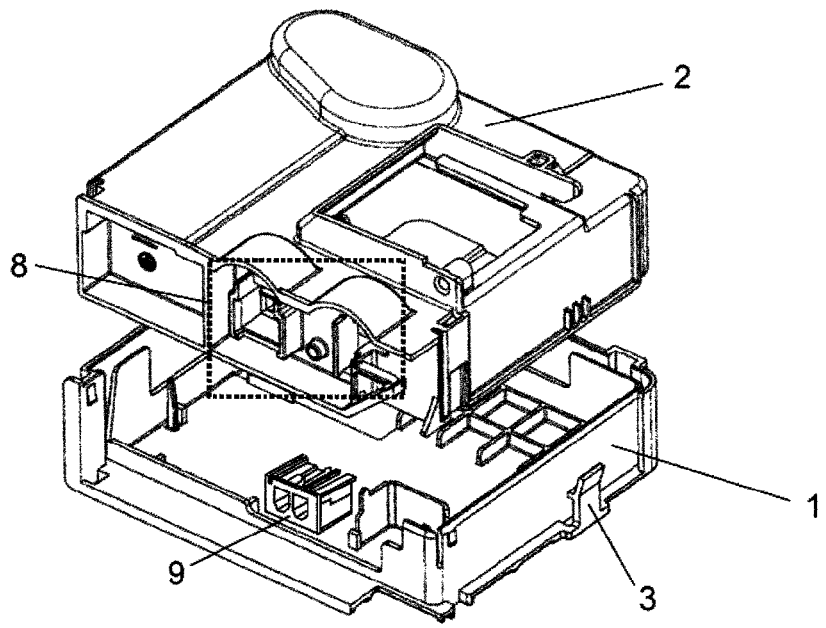
FIG. 2 is a representation of the preferred embodiment of the inverter housing of the present invention in open state.

FIG. 2 illustrates a preferred embodiment of the present invention, wherein the cover 2 is fixed to the base 1 by means of a fastening element 3, which does not require the use of screws. It is possible to note that the cover 2 further has a connection area 8, which aligns with connectors 9 that are part of the internal elements 4 and are fixed to the base 1, is capable of effecting the connection and locking of wires and cables without using cable fasteners 9. In this way, the connection area 8 is configured for direct fixation of connection cables to connectors 9 that are part of the internal elements 4 of the housing. Additionally, one can see that the fastening element 3 of the present invention facilitates the closure of the housing, when necessary. This fastening element does not have the function of closing the housing against tampering, serving only to prevent it from being locked during handling and transportation, preventing a subsequent dismounting process when finishing the production process, thus reducing dismounting costs.

Figure 3:
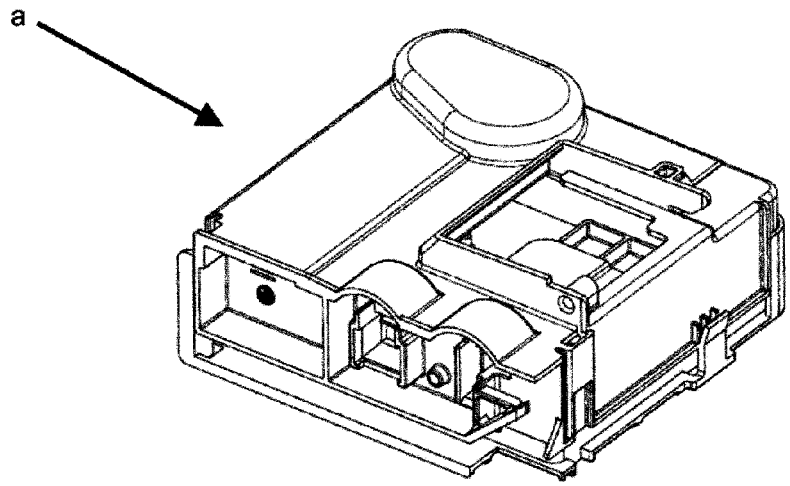
FIG. 3 is a representation of the preferred embodiment of a inverter of the present invention in the reversible locking stage.

To solve the mentioned problems of the prior art, the fastening element 3 has two different stages for locking the cover 2 to the base. The first reversible locking stage a, which is represented in FIG. 3, is commonly used while storing and transporting the housing, for protection of the internal elements 4. These steps take place when a part of the internal elements 4 of the final product is completed and fixed to the base 1 at place of low production cost. A basic example for the case of said compressor inverter is when electric components such as resistors, capacitors and transformers are mounted at the first stage. After this initial production stage, the cover 2 is locked to the base 1 at the reversible locking stage a of the fastening element, which is configured to enable opening the housing for access to the internal elements 4.

After locking, the housing is usually stored and subsequently transported to a location where experts complete the assembly and tests of the apparatus. The reversible locking stage a of the fixation element 3 is configured for the housing to be stored and transported in open state, with a vertical spacing between the base 1 and the cover 2, preferably of about 10 mm, so that no device will be necessary to open it. The second location may be a room other than the production line of the same factory, or most often another factory, even in another country, the invention being advantageously employed in situations in which this transportation is carried out by mating pieces, that is, wherein kits containing at least one base 1 and one cover 2 are sent to the destination location.

Figure 4:
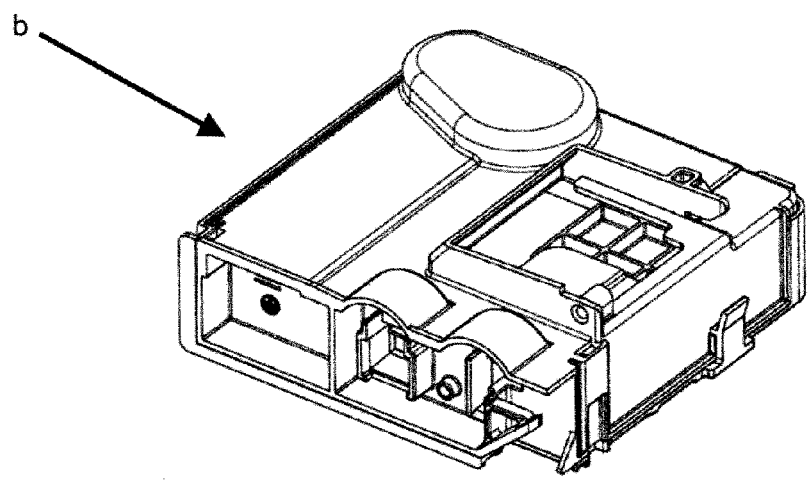
FIG. 4 is a representation of the preferred embodiment of the inverter housing of the present invention in the irreversible locking stage.

After transportation of the housing, an expert will revert the reversible locking stage a of the fastening element 3, that is, revert the locking so as to obtain access to the internal elements 4 and to mount the remaining elements, as for example microcontrollers or other specific elements that are more sensitive, while checking the assembly made before. Following this mounting of the remaining internal elements, the product should be tested and, if it is in perfect operation state, the expert will make the final protection of the internal elements 4 of the product by using a second irreversible locking b, as shown in FIG. 4, configured for making the anti-tamper closure of the housing. It should be pointed out that the second irreversible locking stage b is irreversible only manually, but it may be reverted, for instance, for maintenance or cleaning at an authorized technical assistance workshop using an appropriate tool. Thus, the use of the fastening element 3 of the present invention results in a new production method comprising four different steps, namely:

(a) mounting a part of the internal elements 4 onto the base 1;

(b) locking the cover 2 onto the base 1 by means of first reversible locking stage a of the fastening element 3, configured to keep a vertical spacing between the base 1 and the cover 2 and to enabler opening of the housing for access to the internal elements 4;

(c) reversing the locking of the housing and mounting the remaining internal elements 4 onto the base 1;

(d) locking the cover 2 onto the base 1 by means of a second irreversible locking stage b of the fastening element 3, configured to make the anti-temper closure of the housing and protect the internal elements 4 mounted on the base 1.

FIGS. 5 to 16 illustrate various constructive embodiments that may be applied in creating a fastening element 3 with two different stages, which will be explained in detail hereinafter. In the preferred embodiments of the present invention, the fastening element 3 is constituted by a polymer that is injected together with the base, which simplifies the production of the housing.

Figure 5:
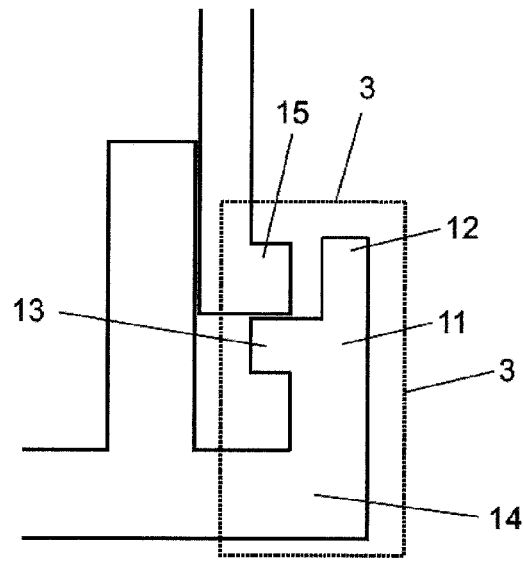
FIG. 5 is a representation of a preferred embodiment of the fastening element of the present invention in the reversible locking stage.
Figure 6:
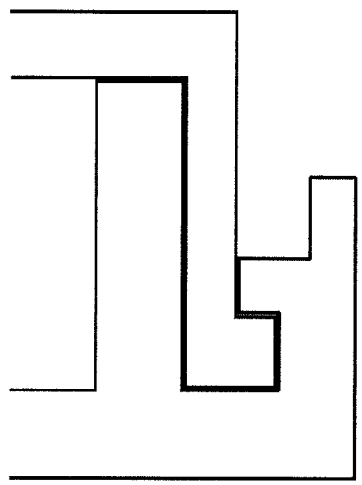
FIG. 6 is a representation of the preferred embodiment of the fastening element of the present invention in the irreversible locking stage.

FIGS. 5 and 6 illustrate the preferred embodiment of the present invention, FIG. 5 being the representation of the fastening element 3 at the reversible locking stage a, and FIG. 6 being the representation of the fastening element at the irreversible locking state b. In this construction, the fastening element 3 has a connection base 14 at a lower portion, in general constructively linked to the base 1, also in its lower portion. From this connection base 14, the body of the fastening element 3 rises vertically, which further has a division region 11, preferably in a central portion with respect to an opening lock 12 and the connection base 14. This division region 11 separates, preferably orthogonally, the opening lock 12 from a fastening body 13. Additionally, in this embodiment, the cover 2 has a locking protrusion 15.

During the process of storing and transporting the housing, which uses the reversible locking stage a, the vertical movement of the cover 2 is limited by resting on the fastening body 13, while the horizontal movement of the cover 2 is limited by the opening lock 12. Thus, the housing can be transported without problems and, additionally, a number of housings may be stacked on each other, the number being limited only by the force that actuates on the fastening body 13, so that the latter will not break.

Additionally, during the irreversible locking state b, the fixation body 13 may be constructed so as to make pressure on the side of the cover 2, as shown in FIG. 6, the locking protrusion 15 of the cover additionally limiting the vertical movement of the cover 2. In this way, the cover 2 is fixedly locked onto the base 1, and it is further defined that the constructive calculation of the fastening element 3 may be carried out so that the lateral movement thereof will cause it to break, that is, if the cover 2 is fixed onto the base 1 by using the irreversible locking stage b, an attempt to open the fastening element 3 will need a force that will cause it to break.

Figure 7:
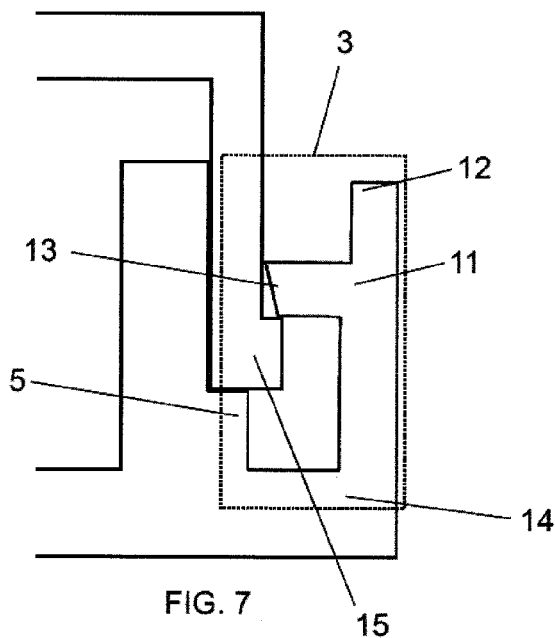
FIG. 7 is a representation of an alternative embodiment of the fastening element of the present invention in the reversible locking stage.
Figure 8:
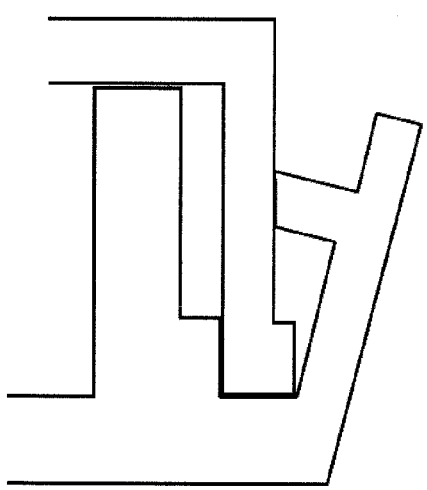
FIG. 8 is a representation of an alternative embodiment of the fastening element of the present invention in the irreversible locking stage.

FIGS. 7 and 8 describe first alternative embodiment of the fastening element 3, having also a division region 11, an opening lock 12, a fastening body 13 and a connection base 14. The distinction of this construction of the fastening element is due to the fact that the base 1 additionally comprises a relief 5, configured to aid in fixing the cover 2. It is noted, in this embodiment, that the vertical movement of the cover 2 is limited by the relief 5, by the fastening body 13 and by the locking protrusion 15. In this way, it is possible to stack more housings, since the maximum number of housings to be stacked is limited, in this construction, by the force on the relief 5, not by the force on the fastening body 13. Since the relief 5 is constructed adjacent the side of the base 1, it has much greater resistance than the fastening body 13. Additionally, this construction has a possible angulation of the body of the fastening element 3 with respect to the connection base 14, resulting in greater pressure of the fastening body 13 onto the cover 2. Additionally, this construction has an angulation on the fastening body 13 to increase the pressure on the cover 2 as well.

Figure 9:
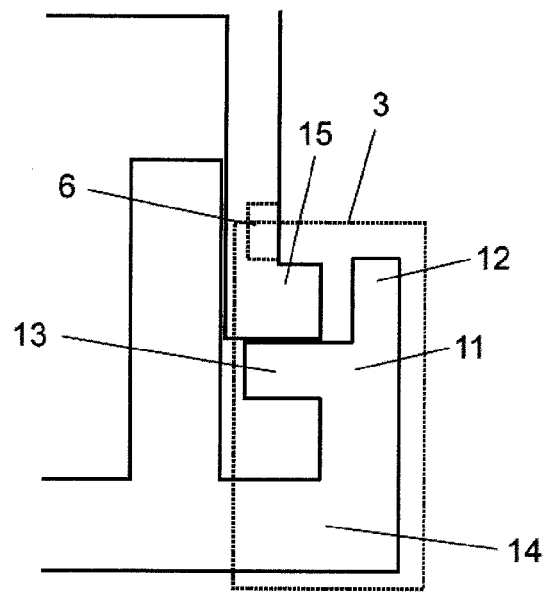
FIG. 9 is a representation of a second alternative embodiment of the fastening element of the present invention in the reversible locking stage.
Figure 10:
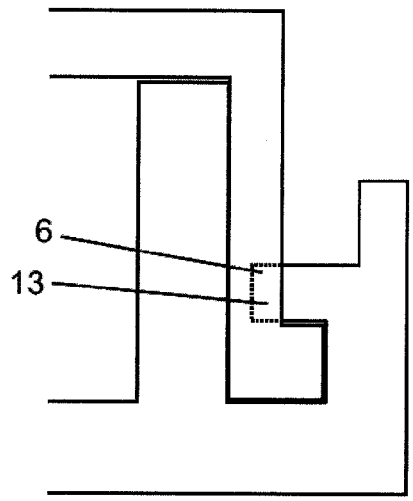
FIG. 10 is a representation of a second alternative embodiment of the fastening element of the present invention in the irreversible locking stage.

In this regard, FIGS. 9 and 10 illustrate a second alternative embodiment of the fixation element 3. Again, this embodiment comprises a division region 11, an opening lock 12, a fastening body 13 and a connection base 14. Besides a locking protrusion 15, the cover 2 also comprises, in this construction, a recess 6, which further increases the locking security of the cover 2 on the base 1. In this way, the irreversible locking stage b is configured so as to cause a part of the fastening body 13 to be inserted into the recess 6 of the cover. Thus, besides the pressure exerted by the horizontal force of the fastening body 13 on the side of the cover 2, which prevents vertical movement of the cover, the fastening body 13 inserted into the recess 6 will also exert a vertical force that prevents such movement. One observes that, in this type of construction, the fastening body 13 and, consequently, the recess 6, may be prolonged into the cover, so that it will be virtually impossible to withdraw it after engagement. Preferably, the recess 6 should have dimensions sufficient for insertion of the fastening body 13, without leaving space for the fastening body 13 to move and cause a clearance of the fastening element. In this way, in a preferred embodiment, the recess 6 has a rectangular geometry of dimensions that are somewhat larger than the dimensions of the fastening body 13.

Figure 11:
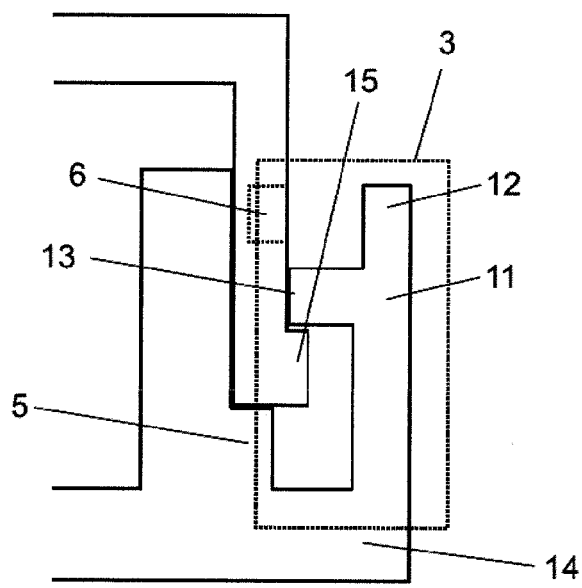
FIG. 11 is a representation of a third alternative embodiment of the fastening element of the present invention in the reversible locking stage.
Figure 12:
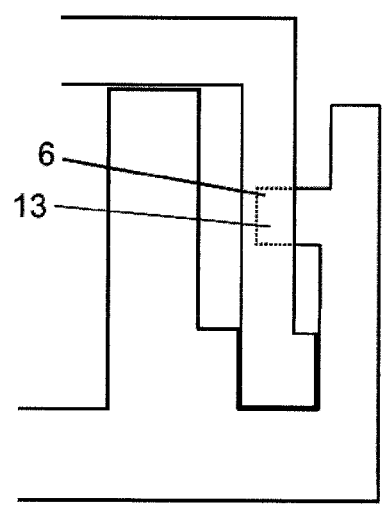
FIG. 12 is a representation of a third alternative embodiment of the fastening element of the present invention in the irreversible locking stage.

FIGS. 11 and 12 show a third alternative embodiment of fastening element 3, which makes use of the elements presented by FIGS. 9 and 10 in conjunction with the relief 5, shown in FIGS. 7 and 8 before. In this way, the double fixation of the system by using the relief 5 and the fastening body 13 inserted into the recess 6 results in greater security for the irreversible locking stage b.

Figure 13:
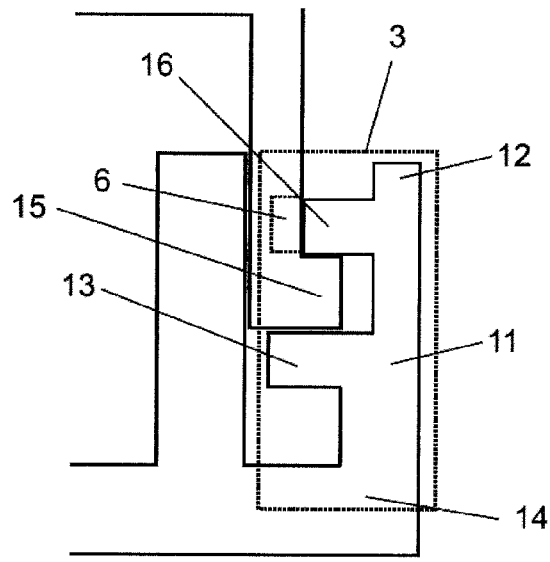
FIG. 13 is a representation of a fourth alternative embodiment of the fastening element of the present invention in the revisable locking stage.
Figure 14:
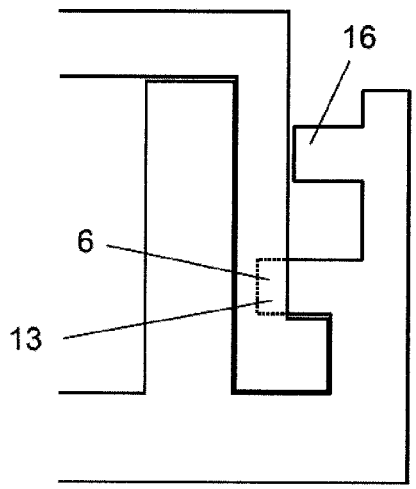
FIG. 14 is a representation of a fourth alternative embodiment of the fastening element of the present invention in the irreversible locking stage.

Using the concept of the recess 6, FIGS. 13 and 14 further show an additional fastening body 16, besides the elements already explained, which are a division regions 11, an opening lock 12, a fastening body 13 and a connection base 14, all of them on the fastening element 3, and additionally the locking protrusion 15 on the cover 2. The additional fixation element 16 should preferably be parallel to the fastening body 13 and have a width smaller than that of the fastening body 13, in order to facilitate further the disengagement of the additional fastening body from the recess 6. In this way, the additional fastening body 16 may be configured to have greater height than the recess 6 and, therefore, not be inserted in such a recess.

Figure 15:
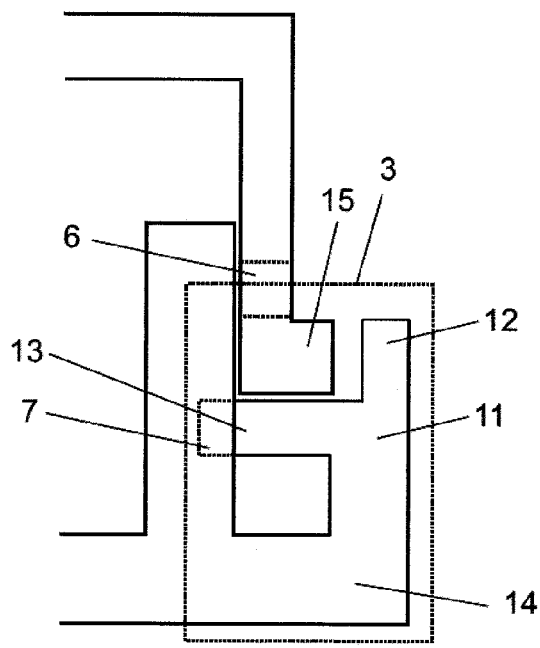
FIG. 15 is a representation of a fifth alternative embodiment of the fastening element of the present invention in the revisable locking stage.
Figure 16:
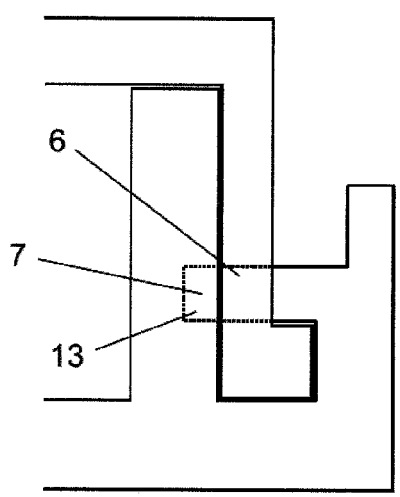
FIG. 16 is a representation of a fifth alternative embodiment of the fastening element of the present invention in the irreversible locking stage.

The latter embodiment, shown in FIGS. 15 and 16 of the present invention illustrates an additional oriented recess 7 on the base 1. Such an additional oriented recess 7 may have substantially the same dimensions and geometries of the recess 6 of the cover 2 and may be substantially at the same position with respect to the fastening body 13 of the fastening element 3. In this way, the fastening body 13 is configured to be inserted into the recess 6 and into the oriented recess 7 simultaneously.

Although in all disclosed embodiments the cover 2 has a locking protrusion 15, such a region serves only as anti-opening guaranty after the locking using the irreversible locking stage b. Thus, the cover 2 may be constructed with a smooth part and, therefore, without the locking region, being fixed only by the pressure exerted by the fastening body 13. Additionally, for utilization of the irreversible locking stage b, one may employ adhesive materials or glues, generally on the fastening body 13, for better fixation and irreversibility of the locking.

Other constructive examples may increase the total width of the fastening element 3, using virtually the entire side of the housing for fixation thereof. Such constructions are limited only by the locking functionality, since an exceptionally large engagement would limit the opening functionality of the lock during the reversible locking stage a, and the possible constructive resistance of the side of the cover 2, since a recess 6 extending throughout the cover 2 would drastically influence the resistivity of the side.

It is also possible to carry out the invention by using a larger number of smaller fastening elements 3, obviously limited by the same factors. In this way, due to the specific constructions of this system, the side body of the fastening element 3 should have, preferably, between 5% and 80% of the side of the cover 2. One can observe that FIGS. 2 and 4 show a fastening element 3 with a side body having approximately 10% of the side body of the cover 2.

Finally, the embodiments of this fastening element 3 and of the protection housing are preferably employed in the construction of a housing of a inverter for electric compressors. Therefore, a inverter that uses the housing and the compressor using such a inverter are within the scope of this invention.

Preferred examples of embodiments having been described, one should understand that the scope of the present invention embraces other possible variations, being limited only by the contents of the accompanying claims, which include the possible equivalents.

The invention claimed is:

1. A system for locking housings that comprise a base (1), a cover (2) and internal elements (4) arranged in an internal portion of the base (1),
   the cover (2) being locked onto the base (1) by means of at least one fastening element (3),
   wherein the fastening element (3) comprises a first reversible locking stage (a) and a second irreversible locking stage (b),
   the locking system being configured so that the reversible locking stage (a) enables one to open the housing for access to the internal elements (4) and the irreversible locking stage (b) effects the tamper-proof closure of the housing.

2. The housing locking system according to claim 1, wherein the base (1) comprises a relief (5) for securing the cover (2) during the reversible locking stage (a).

3. The housing locking system according to claim 2, wherein the relief (5) is configured to keep a vertical distance of substantially 10 mm between the base (1) and the cover (2).

4. The housing locking system according to claim 1, wherein the fastening element (3) comprises, at the most, 80% of the base length (1).

5. The housing locking system according to claim 1, wherein the cover (2) comprises a recess (6) for insertion of a fastening body (13) of the fastening element (3).

6. The housing locking system according to claim 5, wherein the recess (6) comprises rectangular geometry.

7. The housing locking system according to claim 1, wherein the base (1) comprises an oriented recess (7) for insertion of a fastening body (13) of the fastening element (3).

8. The housing locking system according to claim 7, wherein the oriented recess (7) of the base (1) comprises substantially the same dimensions and geometries of the cover (2) recess (6) and is substantially in the same position with respect to the fastening body (13) configured for insertion into the recess (6) and into the oriented recess (7) simultaneously.

9. The housing locking system according to claim 1, wherein the cover (2) comprises an insertion area (8) for fastening connection cable directly to the connections (9) that are part of the internal elements (4) of the housing.

10. The housing locking system according to claim 1, comprising more than one fastening element (3).

11. A housing fastening element (3) to fasten housings comprising a base (1), a cover (2) and internal elements (4), wherein the cover (2) is fastened to the base (1) by the fastening element (3), for protecting the internal elements (4), the fastening element (3) comprising a first reversible locking stage (a) and a second irreversible locking stage (b), the reversible locking stage (a) being configured to enable protection of the internal elements (4) and to enable opening of the housing for access to the internal elements (4), and the irreversible locking element (b) being configured to effect the tamper-proof closure of the housing.

12. The fastening element (3) according to claim 11, further comprising a division region (11), an opening lock (12), a fastening body (13) and a connection base (14), the connection base (14) being constructively linked to the base (1) at its lower portion from the connection base (14), the body of the fastening element (3) rising vertically, the division region (11) being located in a central position with respect to the opening lock (12) and the division region (11) separating orthogonally the opening lock (12) from the fastening body (13).

13. The fastening element (3) according to claim 11, wherein the cover (2) further comprises a lock protrusion (15) and a recess (6), configured so that the fastening body (13) will be inserted into the recess (6).

14. A protection housing for an electric compressor inverter, the housing comprising a base (1), a cover (2), at least one fastening element (3) and internal elements (4), the cover (2) being locked to the base (1) by the fastening element (3), protecting the internal elements (4) that are fastened to the base (1), wherein the fastening element (3) comprises first reversible locking stage (a) and a second irreversible locking stage (b), the reversible locking stage (a) being configured to enable protection of the internal elements (4) and to enable opening the housing for access to the internal elements (4), and the irreversible locking stage (b) being configured for effecting the tamper-proof closure of the housing.

* * * * *